(12) United States Patent
Niedermeyer

(10) Patent No.: US 7,343,913 B2
(45) Date of Patent: Mar. 18, 2008

(54) PARABOLIC TROUGH SOLAR COLLECTOR FOR FLUID HEATING AND PHOTOVOLTAIC CELLS

(75) Inventor: William Paul Niedermeyer, Green Bay, WI (US)

(73) Assignee: William P. Niedermeyer, Green Bay, WI (US)

( * ) Notice: Subject to any disclaimer, the term of this patent is extended or adjusted under 35 U.S.C. 154(b) by 375 days.

(21) Appl. No.: 11/204,085

(22) Filed: Aug. 15, 2005

(65) Prior Publication Data
US 2007/0034207 A1    Feb. 15, 2007

(51) Int. Cl.
F24J 2/52    (2006.01)
F24J 2/38    (2006.01)

(52) U.S. Cl. .................. 126/696; 126/605; 126/651; 126/906; 136/248

(58) Field of Classification Search .............. 126/600, 126/605, 606, 651, 652, 654, 664, 668, 696, 126/704, 709, 710, 711, 906; 136/244, 245, 136/246, 248
See application file for complete search history.

(56) References Cited

U.S. PATENT DOCUMENTS 3,841,738 A * 10/1974 Caplan ................. 359/852
4,078,549 A *  3/1978 McKeen et al. ........... 126/606
4,190,037 A *  2/1980 Niedermeyer ............. 126/655
4,220,136 A *  9/1980 Penney .................. 126/600
4,332,238 A *  6/1982 Garcia, Jr. ............... 126/578
4,340,035 A *  7/1982 Begun .................. 126/676
4,372,651 A *  2/1983 Hutchison ................ 359/852
4,373,513 A *  2/1983 Materna ................ 126/573
4,416,263 A * 11/1983 Niedermeyer ............. 126/694
5,727,585 A *  3/1998 Daume et al. ............. 136/246

FOREIGN PATENT DOCUMENTS

DE    198 37 189 C1 *  9/1999
JP    56-67804 A *  6/1981

* cited by examiner

Primary Examiner—Josiah C. Cocks

(57) ABSTRACT

A solar concentrating collector includes corrugated board parabolic support segments with flexible strips and side tabs over the cut edge to support a laminate with reflective coated film. The reflector assembly has supporting arms and pivots about a heat absorbing conduit secured to vertical extensions of adjacent stationary posts. Selected external surfaces are weatherproofed. The conduit includes vacuum insulators and means to isolate conduit from insulator expansion. Upper arms support pulleys and cable take-ups for continuous collector position changes. Cross members of the extended post secure the fixed conduit, and at a higher level, a programmable drive to rotate two cable capstans for cables that pivot two adjacent reflector assemblies. Other embodiments include triangular or square fluid conduits with planar surfaces for photovoltaic cells and a modified reflective surface to disperse solar rays into a band of reflected sunlight directed to photocell areas.

19 Claims, 9 Drawing Sheets

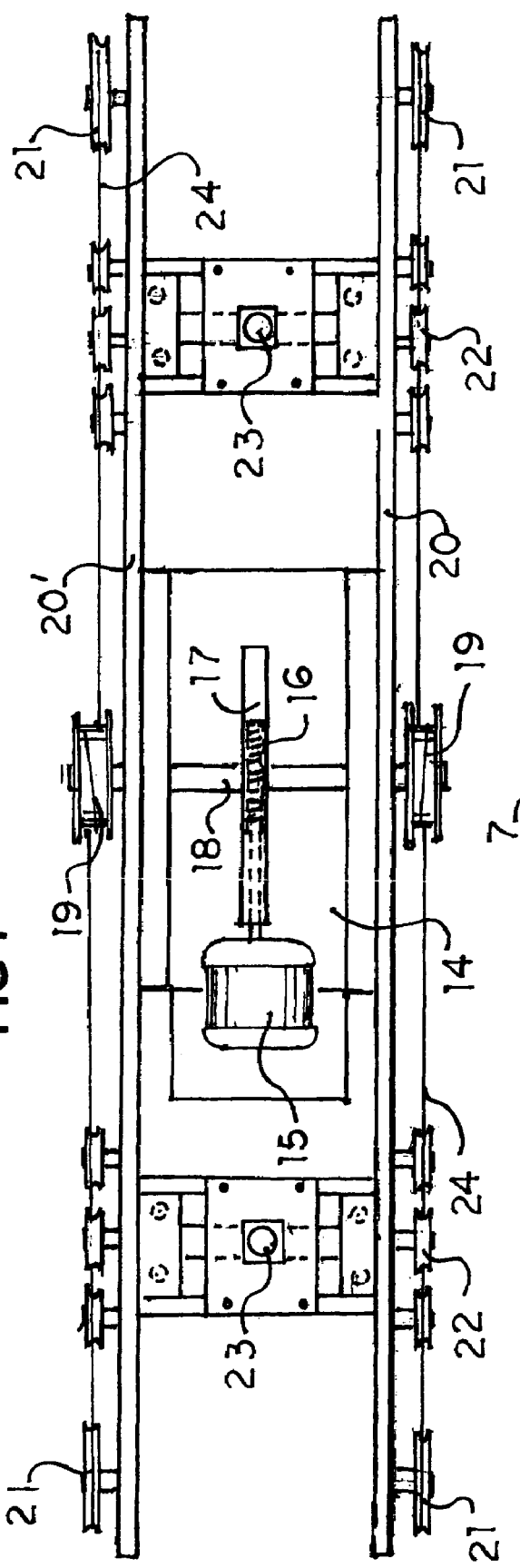

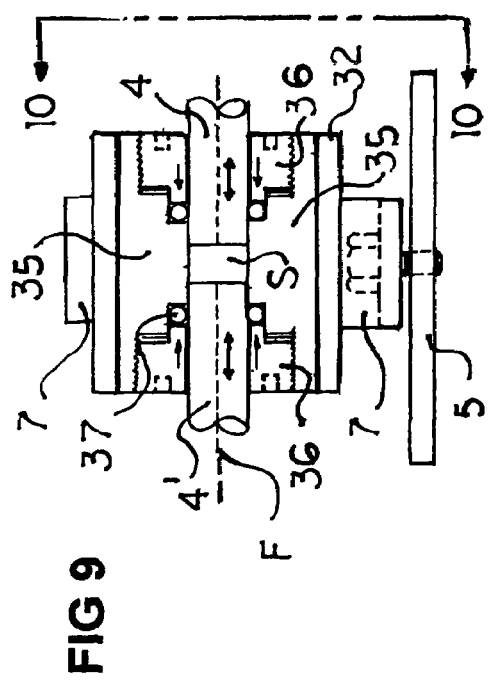
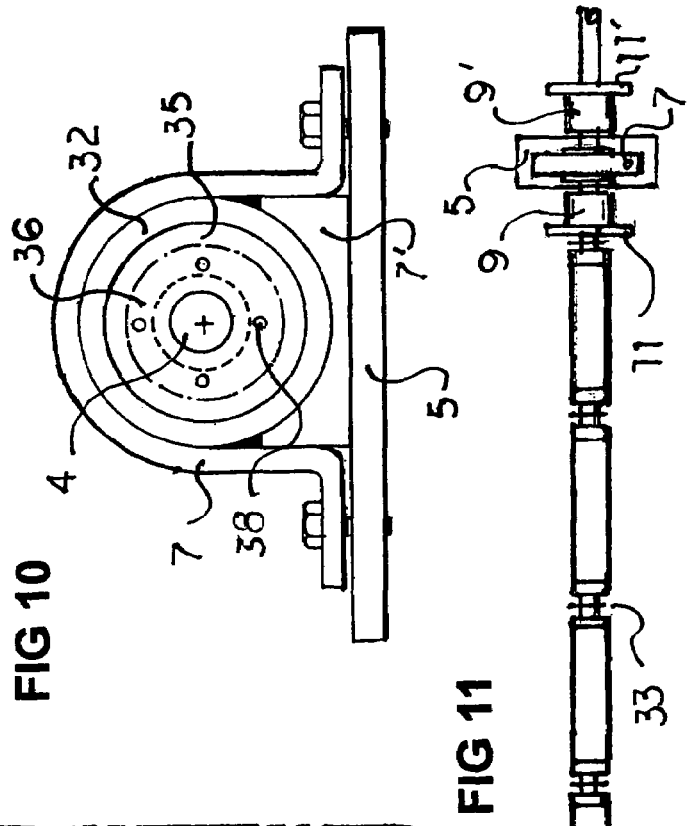
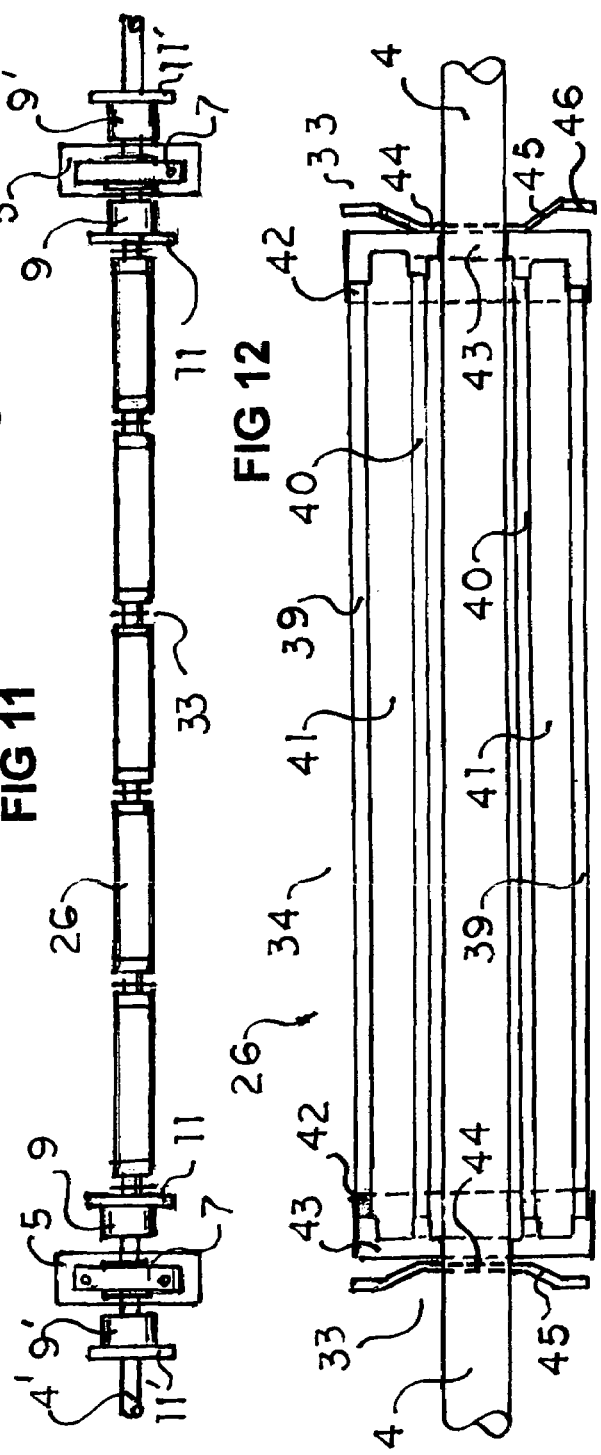

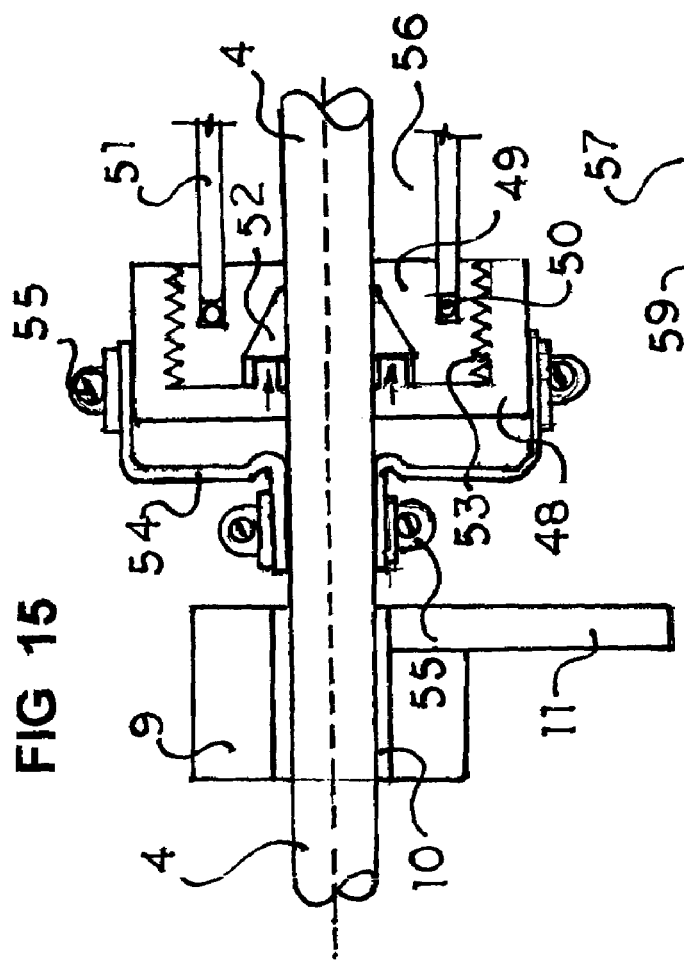
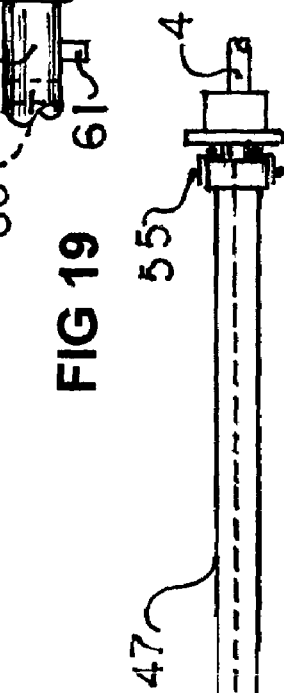
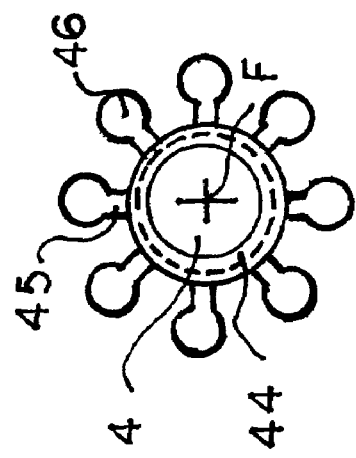
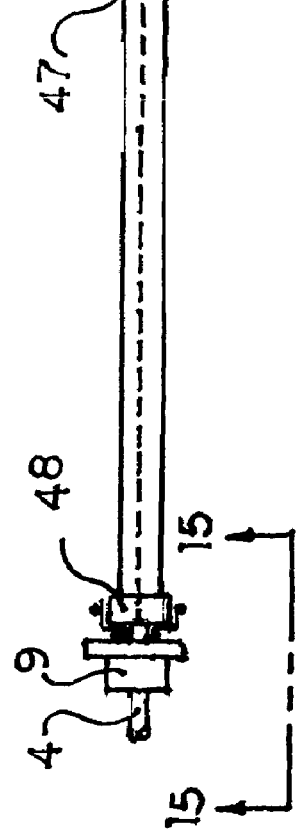

US 7,343,913 B2

PARABOLIC TROUGH SOLAR COLLECTOR FOR FLUID HEATING AND PHOTOVOLTAIC CELLS

BACKGROUND AND SUMMARY OF THE INVENTION

The use of linear parabolic reflector troughs for concentrating solar rays on a heat collector pipe is well known. Prior collector systems for heating fluids to generate power depend from and use many of the same components as systems going back 40 or more years.

Several current "state of the art" solar energy generating plants (SEGS) ranging from 30 to 320 megawatts are operating in the Mojave desert of California. The collectors include spaced parabolic truss supports extending transversely from about 6 to 18 ft wide. Collector systems heat fluids from 560 degrees to over 700 degrees F., and all use trusses extending outward from a pivoting central structure or tube, to support cast linear parabolic shaped mirrors to form the trough.

Current parabolic mirror reflectors and trusses together with the attached absorber conduit are pivoted about a central structure or tube using hydraulic actuators and speed reduction gear boxes.

The reflected rays are focused on a metallic pipe of extended length enclosed within a vacuumized glass tube of equal length.

Current designs have inherent cost and maintenance problems which together with the cyclic nature of the sun (including cloudy days) prevents solar power generating plants from producing cost effective power available around the clock. To mitigate these limitations, solar heat and natural gas power generation were used in a "combined cycle" system on some of the SEG plants.

Aside from cost and operating differences, the combined cycle plant still had CO2 emissions and is subject to fossil fuel price fluctuations or supply disruptions.

Generally, all solar collector power systems perform the same functions and require the same basic components including a parabolic reflector to focus solar rays on a heat absorbing conduit. Other components added to increase conversion efficiency include means to continuously pivot the reflector as the sun moves from east to west and the vacuumzed glass tube surrounding the heat absorbing pipe to reduce emissive heat loss to ambient air.

Because of the gradient from ambient temperature to maximum, the difference in expansion of the glass tube and absorber pipe in current SEG designs requires an "expansion bellows" between sections of conduit and are prone to leakage and loss of vacuum. Components of the invention lower emission heat loss and vacuum leakage.

The instant collector system of this invention relies on basic components disclosed in current systems, but due to substantial weight reduction uses downwardly extending arms to suspend the reflector panel for pivoting about a fixed absorber conduit supported from simplified panel supports at both ends, The instant collector system counters the difference in expansion of pipe and enclosing glass by eliminating bellows of current designs and using a plurality of conduit insulators comprised of two concentric tubes sealed at the ends to define a vacuum space. Insulators are separated by resilient compression springs to allow for insulator expansion independent from expansion of the pipe. The insulator has central openings and surrounds the pipe. Supports for the fixed conduit and a suspended reflector panel are simplified because of weight reduction.

Prior art U.S. Pat. No. 4,416,263 described transversely aligned parabolic segments supported on a truss sub-base structure. The instant collector uses similar parabolic segments combined with other corrugated board members to define a unitary structure to eliminate the underlying truss substructure and underlying pivot shafts and bearings that rotate the '263 reflector.

The primary objective of the instant collector system is cost reduction by using low cost corrugated board processed on existing machinery for high speed production of parabolic elements and using a cutting system to make parabolic shapes per U.S. Pat. Nos. 4,190,037 and 4,416,263 which states that flexible members on the top edge of support segments can be either U or L shaped, and cutouts between adjacent tabs can be eliminated if the bending modulus of the flexible piece so allows. FIGS. 2, 3, and 4 of U.S. Pat. No. 4,416,263 show typical flexible pieces.

Prior art U.S. Pat. No. 4,190,037 describes the use of expanded polyurethane, plastics, or corrugated paperboard as materials for support segments (Col 3 lines 35-38).

Using abundantly available and low cost corrugated board stock processed at high speed to form the parabolic shape of transverse segments in a unitary panel, a simplified collector support and pivot system in and vacuum insulators manufactured in large quantities like florescent lights, the instant disclosure offers potential for low cost collection of solar energy for supplementary electric power generation and, with commercially available devices for electrolysis to produce hydrogen from a renewable non-fossil fuel solar energy source for use in fuel cells.

In another embodiment, the heat absorbing fluid conduit allows concentrated solar rays to impinge on photovoltaic solar cells mounted on side planar surfaces. The parabolic curve is modified to project a dispersed band of solar rays on the extended surface of the solar cells.

With the above and other objectives in view, more information and understanding of the present invention may be achieved by reference to the following detailed description.

BRIEF DESCRIPTION OF THE DRAWINGS

FIG. 7 is a schematic enlarged plan view similar to FIG. 2 viewed from 7-7 of FIG. 5 illustrating the cable drive motor/gears, capstan, cable pulleys and take-ups.

FIG. 8 is a schematic enlarged plan view from 8-8 of FIG. 4 illustrating the conduit coupling with expansion space between adjacent conduit ends, means for clamping the coupling and conduit to the stationary support, and conduit pivot means outside of vertical supports for connection to reflector assembly arms.

FIG. 9 is an enlarged side cross section of the conduit clamp and coupling viewed along 9-9 of FIG. 8 illustrating expansion space between adjacent conduit ends, resilient fluid seals and threaded means to apply a force against the deformable seals. Conduit and clamping means are secured to the stationary support.

FIG. 10 is an enlarged end view of the clamp and coupling shown in FIG. 9.

FIG. 11 is a side elevation of a collector conduit illustrating reflector support members at both ends with a plurality of intermediate conduit vacuum insulators with intermediate flexible members between insulators for expansion takeup.

FIG. 12 is an expanded side elevation of a conduit vacuum insulator illustrating a double glass sealed vacuum chamber, end seal means, and flexible resilient expansion take-ups.

FIG. 13 is an enlarged end elevation of the flexible expansion takeup.

FIG. 14 is a side elevation of a full length single glass embodiment of a vacuum chamber surrounding the heat absorbing conduit.

FIG. 15 is an enlarged side elevation of a conduit end seal for the single vacuum chamber of FIG. 14.

FIG. 19 is a side elevation of a conduit coupling illustrating transition from triangular/square to round shapes at selected intervals of a collector array. The coupling includes an internal plug and inlet/outlet connections

DETAILED DESCRIPTION OF THE INVENTION

Figure 1:
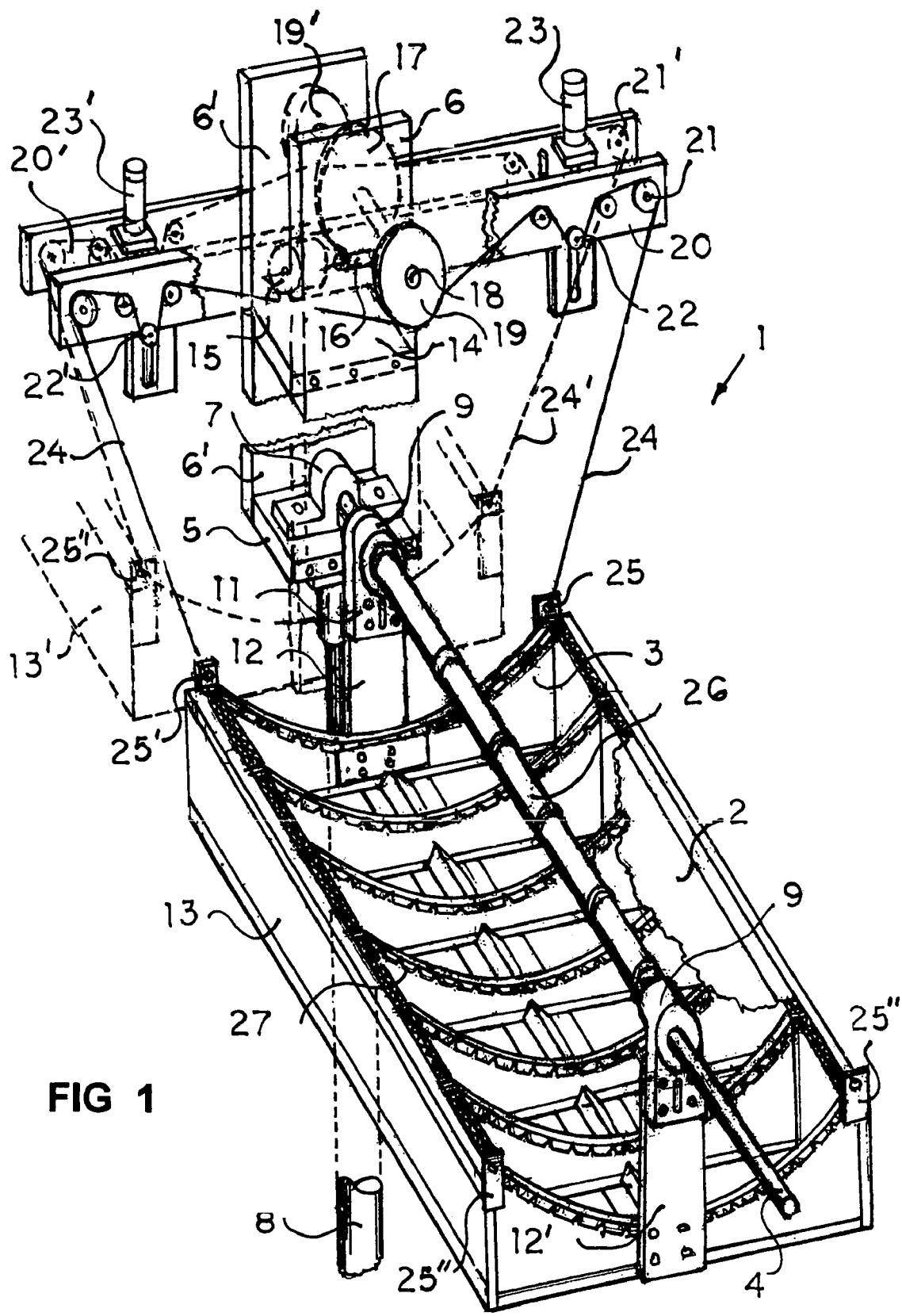
FIG. 1 is a perspective top view of a solar concentrating collector illustrating a unitary reflector assembly with portions of the reflective surface removed, reflector pivot arms suspended from a conduit secured to a stationary support, a plurality of conduit insulators between pivotable bushings and arm support connections. Vertical plate extensions of the support includes a digital motor, helical/plate gear cable drive and attached members for a cable path with take-ups, pulleys, and connection to the reflector.
Figure 5:
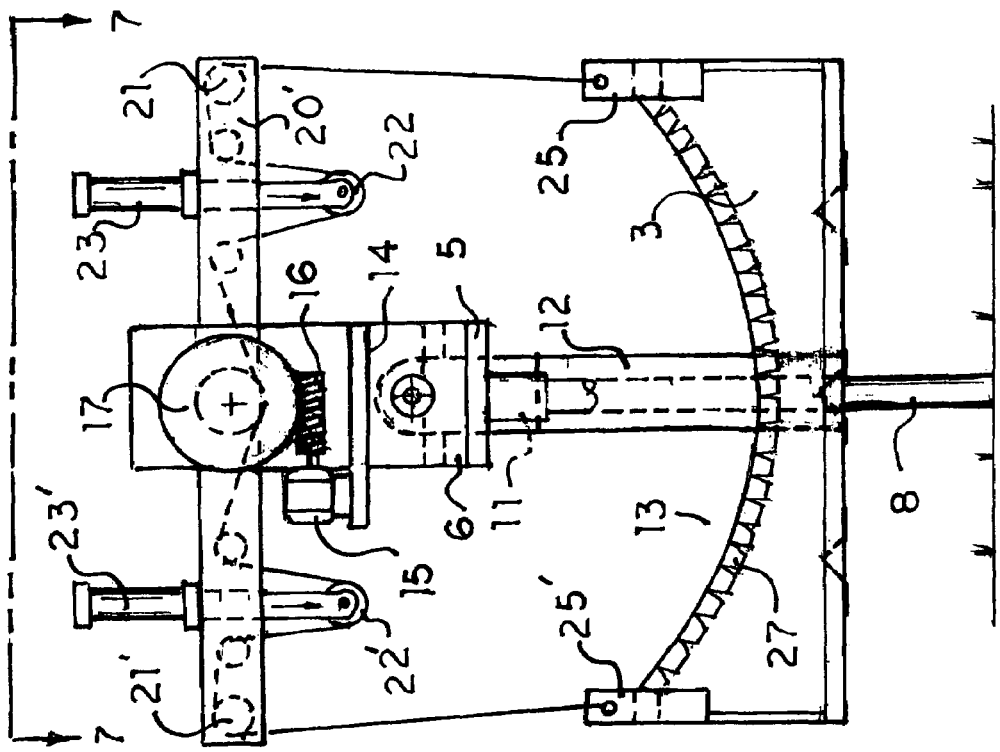
FIG. 5 is a schematic end elevation viewed along 5-5 of FIG. 4 illustrating the centrally mounted digital motor, helical/plate gear drive, pulleys and dual take-up cable drive for pivoting the reflector about the fixed conduit. The reflector is suspended by arms connected to a housing with bushings assembled on the conduit
Figure 6:
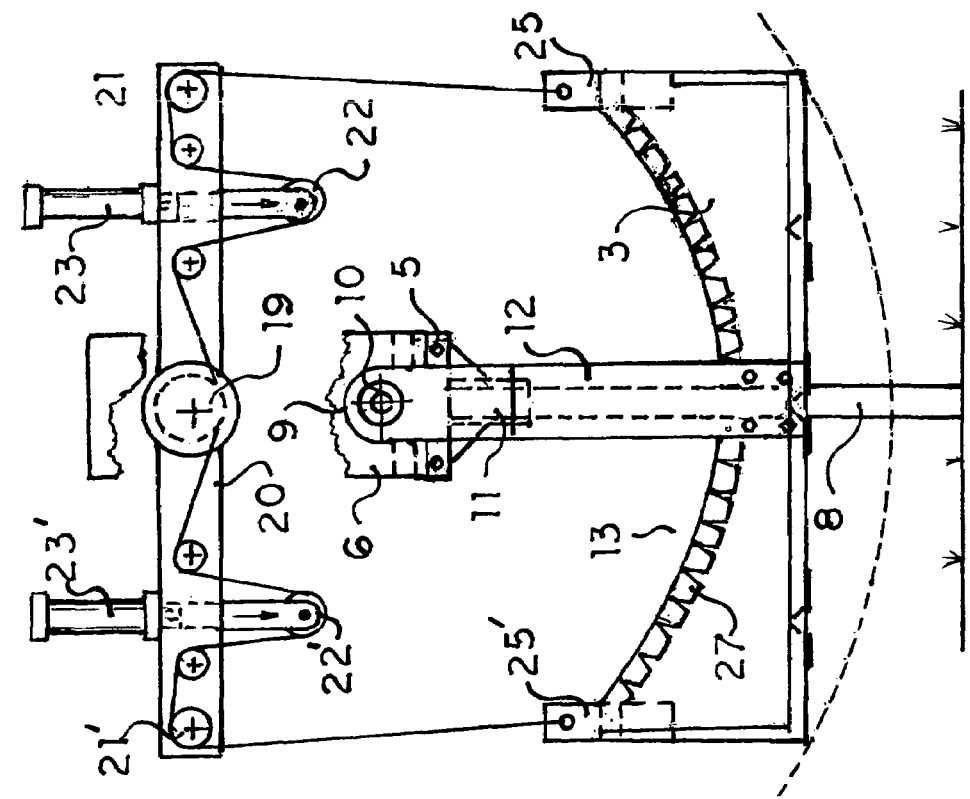
FIG. 6 is a schematic end elevation viewed along 6-6 of FIG. 4 illustrating a capstan, and cable drive pulleys mounted on one of two horizontal support arms, a conduit with pivoting housing connected to a reflector support arm, a unitary reflector and the central stationary support.

In FIG. 1, the parabolic trough concentrating collector 1 reflects solar rays from reflector surface 2 (portions cutaway) supported by a plurality of parabolic shaped transversely aligned corrugated board segments 3 with flexible strips 27 superposed and attached to side surfaces (as shown in FIGS. 1, 5, 6).

Reflected rays are directed to a focal line F co-incident with the centerline of conduit 4 which is secured to cross member 5 of vertically extended support 6 by clamp 7.

In FIG. 1, support extensions 6, 6' and cross supports 5, 14 are attached to stationary post 8 and are fixed. Housing 9 with inside bushings 10 include a downwardly extending portion 11 for connection to and support of reflector support arms 12, 12' which are attached to both ends of unitary reflector 13. The reflector 13, support arms 12, 12', housing extensions 11, 11' and housings 9, 9' pivot from conduit 4.

In FIG. 1, the upper support extensions 6, 6' include cross member 14 to support a programmable motor 15 and helical gear 16 engaging plate gear 17 through cross shaft 18 and turns cable drive capstan pulleys 19, 19' extending from opposite sides of arms 20, 20' to advance cable 24 for pivoting reflector 13 and cable 24' for adjacent reflector 13'. Cable systems for each reflector 13 include air cylinders 23, 23' located between arms 20, 20' attached to vertically slidable take-up pulleys 22, 22', and arranged for cable 24 slack take-up in transverse paths on both sides of the focal plane as the reflector is pivoted from morning to afternoon positions.

In FIG. 1, cylinders 23, 23' control slack for cable path 24 for connection at 25, 25' on opposite sides of reflector 13. A similar cable system with capstan 19' and cylinders 23, 23' mounted on arm 20' define a cable path 24' (shown dashed) to pivot an adjacent reflector 13' for attachment to opposite ends 25", 25" (shown near the bottom of FIG. 1).

In FIG. 1, conduit 4 has a heat absorbing coating, and is surrounded by vacuum insulators 26 detailed in FIGS. 11, 12.

Figure 2:
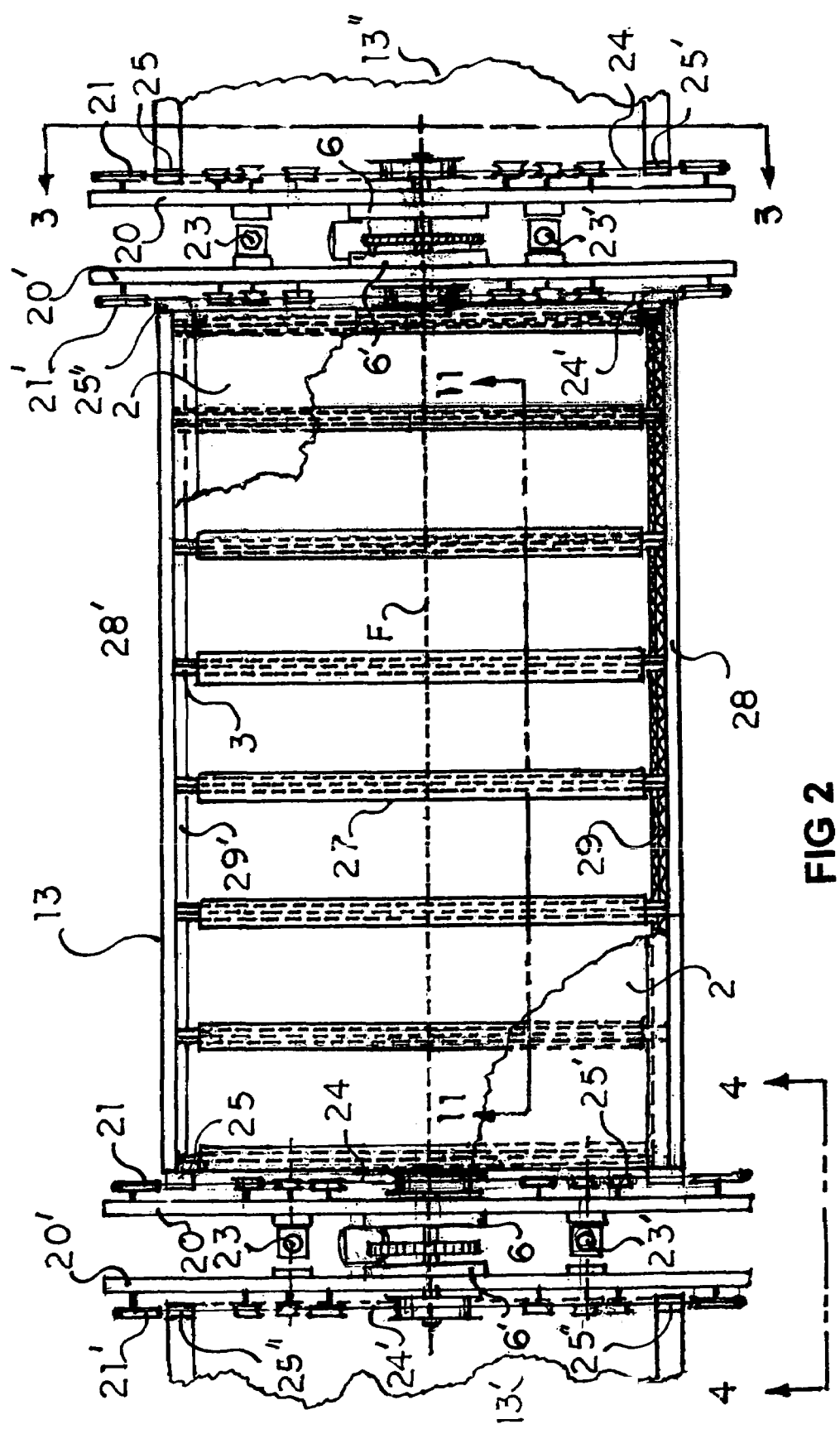
FIG. 2 is a plan top view schematic of a unitary reflector, cable drive systems between adjacent reflectors including cable drive components, pulleys and cable take-ups. The heat absorbing conduit along a focal line and means to secure it to the support are not shown (see FIG. 11) Portions of the reflector surface are cutaway.

In FIG. 2, cable system 24 on support arms 20 on the left side is attached to reflector 13 at 25, 25'. A second cable system 24' on arm 20' (left side) is attached to reflector 13 at 25", 25". Each fixed support between collectors includes cable elements for connection to adjacent reflectors, for example, 13, and 13' on the left side and 13, 13" on the right side.

In FIG. 2, arms 20, 20' are attached to vertical, support members 6. 6'cross supports 5 for supporting conduit clamp 7, and support 14 for cable drive motor 15, helical gear 16 and plate gear 17, and cable pulleys 21 on arms 20, 20'are as described above and further detailed in FIGS. 5, 6.

In FIG. 2, unitary reflector assembly 13 includes parabolic shaped corrugated board supports 3 with flexible strips 27 on the curved surface for bonded attachment of a laminate with a reflective surface or a transparent material with an underlying reflective coating that faces the focal line. Parabolic supports 3 may be contained in slots between members 29 and bonded to 29 and corrugated board side panels 28.

Figure 3:
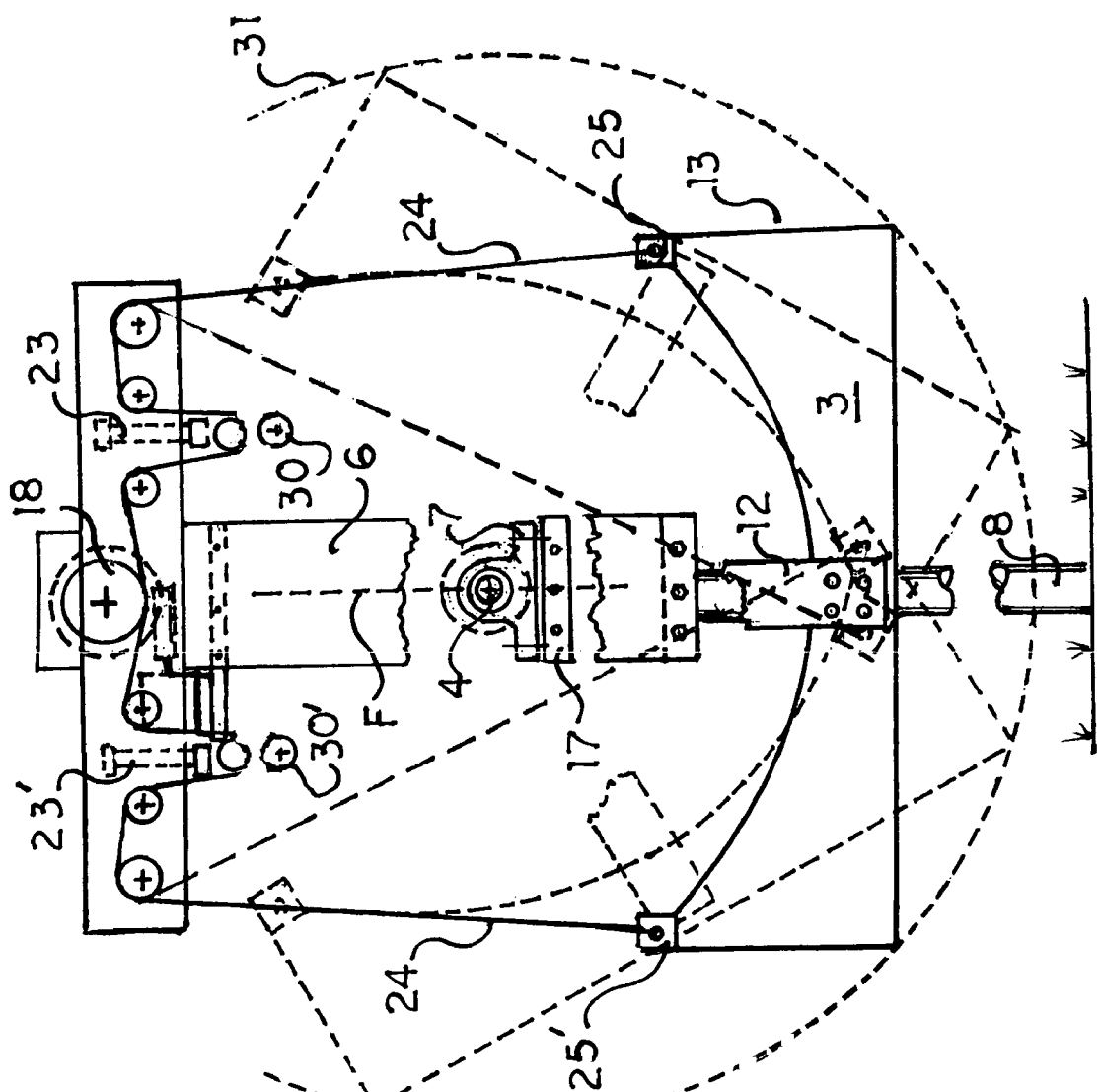
FIG. 3 is an end view schematic viewed from 3-3 of FIG. 2 illustrating the reflector assembly position for concentrating rays at solar zenith (solid), early A.M, and late P.M. (dashed). The cable path for pivoting the reflector about the fixed conduit at solar zenith is shown solid.

In FIG. 3, reflector assembly 13 is symmetrical about focal plane F. Support arms 12, 12' are attached to the reflector and are suspended from portion 11 of housing 9 (shown in FIG. 4) for pivoting about conduit 4.

In FIG. 3, conduit 4 is secured to cross support 5 with clamp 7 and via columns 6, 6' is fixed to stationary post 8.

In the central position (shown solid) cable 24 is attached to reflector 13 as described above.

In FIG. 3, the cable system includes vertically movable pulleys 22, 22' of FIG. 1 and is shown solid with the reflector centered, and in the extended lower position 30, 30' as the reflector pivots in either direction. Multiple cable wraps on the capstan prevent slippage, and slack occurs before and after the capstan when the reflector pivots. Downward movement of take-up pulleys 22, 22' removes slack and maintains cable tension around capstan pulleys 19, 19'. Dashed arc 31 is the path of reflector bottom corners.

Figure 4:
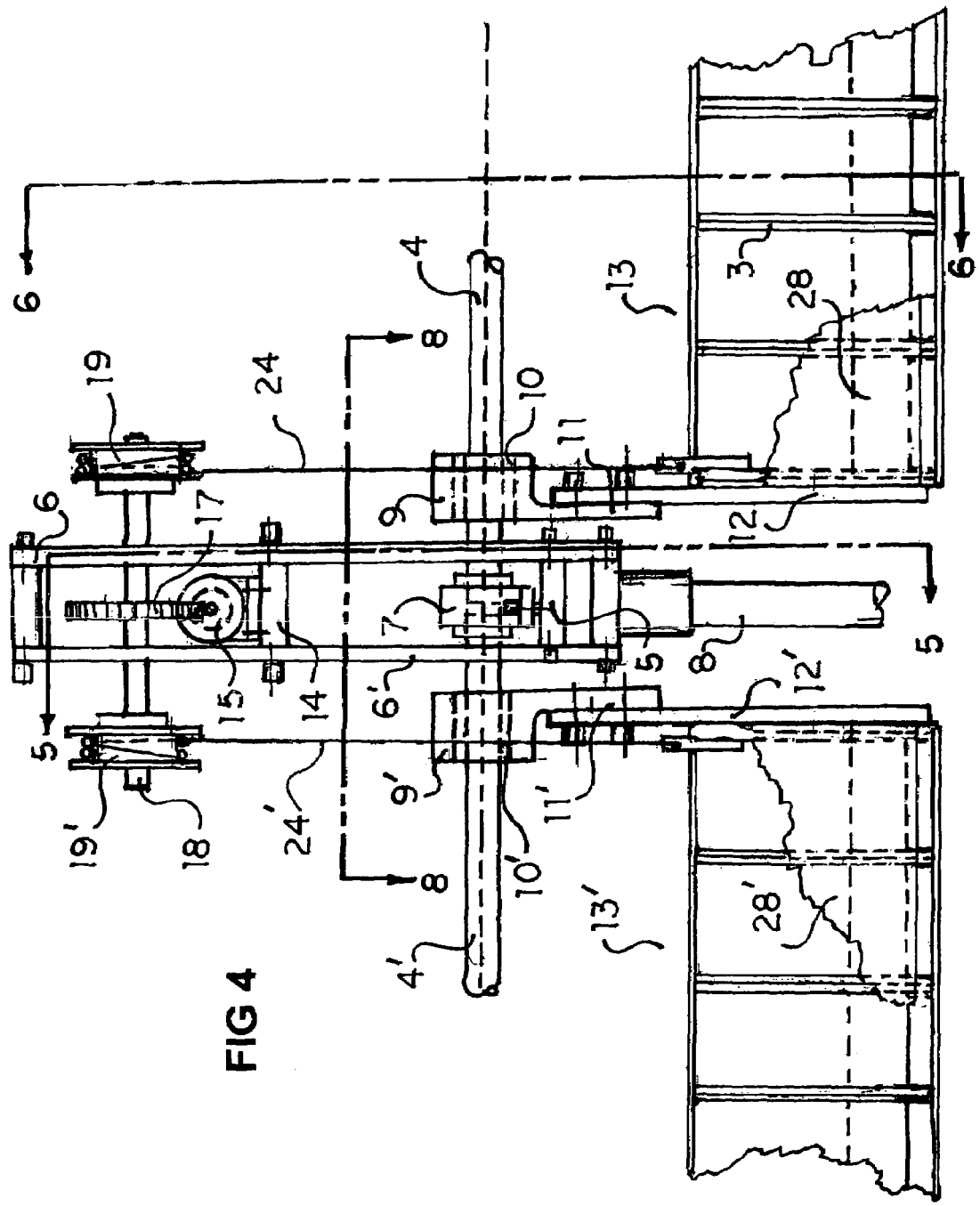
FIG. 4 is a is a side elevation schematic viewed from 4-4 of FIG. 2 illustrating the stationary support between adjacent collectors including vertical extension members to support the motor, helical/plate gear and capstan cable drive system. Vertical members include a plate and clamping means for securing the conduit to the stationary support.

In FIG. 4, anchored post 8 has vertical extensions 6, 6'. Clamp 7 bolted to cross member 5 holds conduit 4 tight against cross support 5 in a non-rotating state. Housings 9, with internal bushing 10 and extension portion 11 are connected to reflector arm 12 and allow reflector 13 to pivot as controlled by the programmed cable drive system.

In FIG. 4, upper cross member 14 supports the cable drive motor 15, and helical gear 16 for engagement with plate gear 17 on shaft 18 which extends beyond vertical supports 6, 6' for attachment of capstans 19, 19' to drive cables 24, 24' as described above. Enlarged views are shown in FIGS. 5-7.

In FIGS. 5 and 6 all components are positioned and function as described herein.

In FIG. 7, plate 14 supports cable drive motor 15 and helical gear 16 for engagement with plate gear 17 on shaft 18 which rotates capstans 19, 19' to drive cable 24, 24' as described above. Cable pulleys 21, take-up pulleys 22 and cylinders 23, 23' are described above.

In FIG. 8, vertical supports 6, 6' include intermediate plate support 5 to support conduit clamp 7. Space S between adjacent conduit ends allows for conduit expansion. See FIG. 9 for conduit expansion seals inside coupling 32 and conduit 4 are held stationary by clamp 7.

In FIG. 8, housing 9 with inside bushing 10, depending portion 11 for connection to reflector arms 12 and the attached unitary reflector 13 pivot about conduit 4 as described above.

Referring back to FIG. 1, a plurality of vacuum insulators 26 comprised of end connectors 26 and inner and outer glass tubes (see FIG. 12) form a closed vacuum chamber 41, are subject to expansion, and can slide on conduit 4.

In FIG. 8, flexible springs 33 at each end of an insulator 26 deflect to absorb expansion without effect on conduit 4 or housing 9.

In FIG. 9. clamp 7 secures coupling 32 and internal parts 35, 36, 37, and conduits 4, 4' spaced apart a distance S for conduit expansion clearance. Expansion of enclosing vacuum insulators 26 is isolated from expansion of conduit 4 (see FIGS. 11, 12). Holes 38 arew for plug adjustment/removal.

In FIG. 9, conduits 4, 4' slide within seal retainer 35, and seal plug 36. The inside circumference of 35 and outer circumference of seal plug 36 are threaded. Plug 36 is screwed inward to compress resilient conduit seal 37 to allow expansion movement parallel to focal axis F.

In FIG. 10, clamp 7 secures coupling 32 and internal parts to cross support 5. Conduit saddle piece 7' supports and positions conduit 4 for peripheral contact by clamp 7.

In FIG. 11, conduit 4 is enclosed within a plurality of vacuum insulators slideable along the conduit and separated by flexible springs 33 to allow expansion of insulators 26 isolated from and without exerting force on conduit 4.

In FIG. 12, double wall insulators 34 include end pieces 43, 43', outer glass tube 39, inner glass tube 40 hermetically sealed as at 42 with vacuum space 41 between 39 and 40. Flexible springs 33 are adjacent insulator ends.

In FIG. 13, annular portion 44 of flexible spring 33 includes offset arms 45 and tabs 46 for contact with and force against end pieces 43, 43' of the Insulator.

In the embodiment of FIG. 14, full length vacuum insulator 47 surrounds conduit 4 and extends between seal end caps 48, 48'. Details of seals for separate expansion of the single glass tube 51 and conduit 4 to maintain vacuum are described in FIG. 15.

In FIG. 15, seal end cap 48 and inside members fit over conduit 4. Inner glass tube retainer 49 includes an annular relief for insertion of seal ring 50 and the end of glass tube 51. Tube retainer 49 bears against seal ring 50. Wedge shaped conduit seal 52 exerts axial force and seal pressure with axial force applied by an annular projection adjacent the conduit (see arrows) as the end cap is advanced inwardly by screw threads 53. Outer flexible boot 54 provides a second vacuum seal between the glass tube and the conduit. Hose clamps 55 tighten outer flex boot vacuum seal 54 against end cap 48 and conduit 4.

Figure 16:
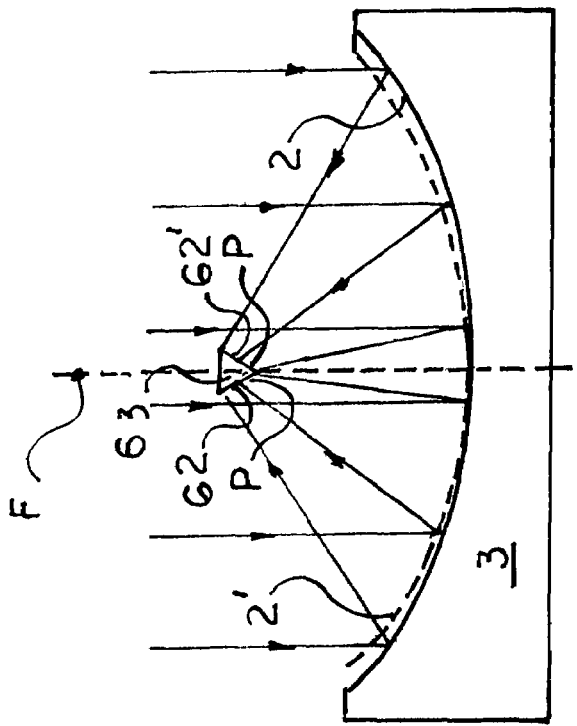
FIG. 16 is an end elevation of a modified parabolic curve reflector surface Illustrating solar rays directed to project a dispersed band of concentrated rays toward a loci of points for absorption on photovoltaic solar cells secured to inclined opposite sides of a triangular fluid conduit. The modified surface curve is shown solid.

In FIG. 16, a reflector surface 2 is superposed over the curved upper edge of a reference parabolic shaped segment 3 (shown dashed) to focus solar rays along a focal line F coincident with the centerline of conduit 4.

In FIG. 16 for use with photovoltaic cells, the segment curve and shape of the reflector surface 2 is modified (shown solid) from a reference shape to reflect and disperse solar rays into a band of light directed to a loci of focal points impinging on photovoltaic cells P secured to both planar surfaces 62, 62' on opposite sides of a triangular fluid conduit 63.

One end of a transition section 57 fits over triangular conduit 63 and the other end fits over a round section of conduit 4 for insertion into coupling 32 (coupling shown in FIG. 9).

Figure 17:
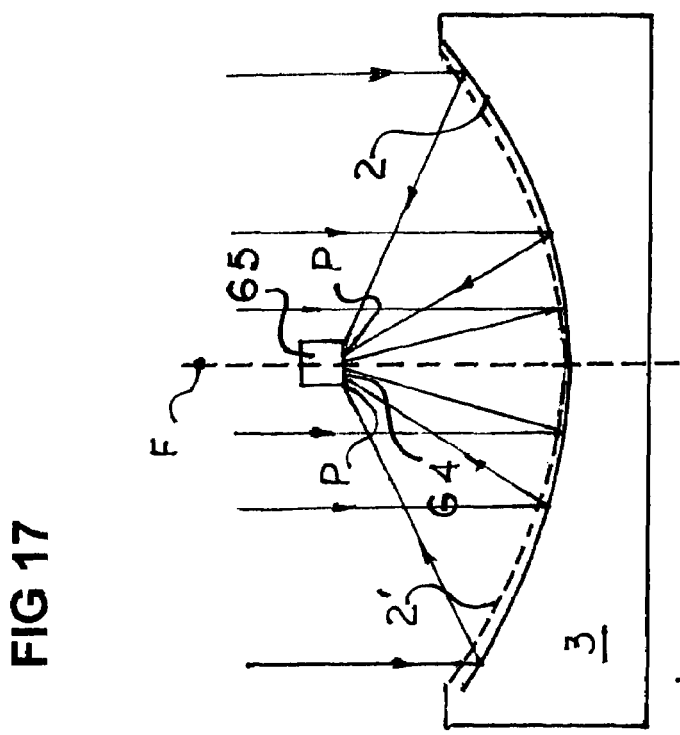
FIG. 17 is an end elevation of a reflector surface modified (shown solid) to reflect and disperse solar rays from both sides toward a loci of focal points along the bottom surface of a square fluid conduit.

In FIG. 17, a reference parabolic reflector 2' is shown dashed.

In FIG. 17 for use with photovoltaic cell, the parabolic curve and reflector shape 2' is modified (shown solid) to reflect solar rays along a loci of focal points to project a band of light on the planar under surface 64 of a square conduit 55 and on photovoltaic cells P secured to the surface.

Transition coupling 57 fits over an end of conduit 55 and over a round piece of conduit 4 for insertion into coupling 32 (coupling shown in FIG. 9).

Figure 18:
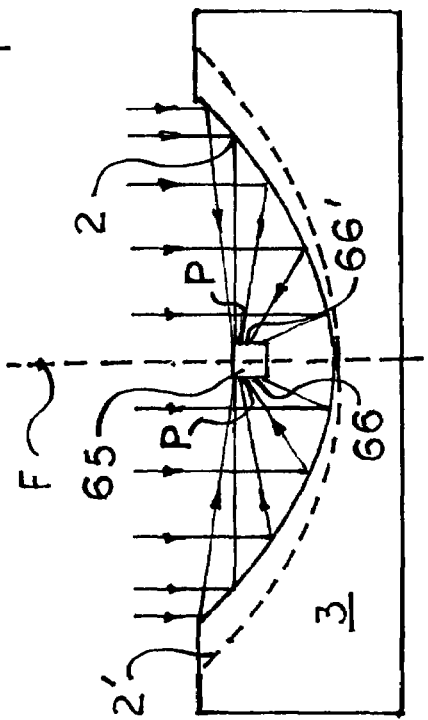
FIG. 18 is an end elevation of a reflector surface modified (shown solid) to reflect and disperse solar rays from each side toward a loci of focal points on opposite sides of a square fluid conduit.

In FIG. 18, a reference parabolic shape 2' is shown dashed. A plurality of segments 3 and the reflector surface 2 are modified (shown solid) to disperse and reflect solar rays as a band of light impinging on photovoltaic cells P on both vertical sides 66, 66' of conduit 65. Transition coupling 57 fits over an end of conduit 65 and over a round piece of conduit for insertion into coupling 32 (coupling shown in FIG. 9)

In FIG. 19, square or triangular shaped conduits provide planar support for photovoltaic cells P and include transition coupling 57 from triangular 58 to round 59 or square or round for insertion into coupling 32 of FIG. 9.

In FIG. 19, pre-selected transition couplings 57 have an internal plug 60 and inlet or outlet connections 61 to expel water over a pre-selected temperature to avoid solar cell damage.

All external surfaces of the unitary reflector assemblies of FIGS. 1, 16, 17, and 18 have an impervious coating for weatherproofing The present invention may be embodied in other specific forms without departing from the spirit or special attributes, and it is therefore not restrictive, reference being made to the appended claims to indicate the scope of the invention.

REFERENCE NUMBERS 1 solar collector
2 reflector surface
3 parabolic transverse supports
4 heat absorbing conduit
5 cross member
6 upper support extension
7 conduit/coupling clamp
8 stationary post
9 housing
10 bushing
11 housing extension
12 reflector support arms
13 unitary reflector
14 cable drive support
15 programmable motor
16 helical gear
17 plate gear
18 drive cross shaft
19 cable drive capstan
20 horizontal arms
21 cable pulleys
22 take-up pulley upper position
23 air cylinder
24 cable
25 cable connector on reflector
26 conduit vacuum insulator
27 flexible strip with tabs
28 reflector side panels
29 para. support retainer
F solar ray focal line.
30 take-up pulley: lower position
31 arc of reflector path
S conduit expansion space
32 conduit coupling
33 flexible spring
34 double glass insulator
35 seal retainer
36 seal plug
37 conduit seal
38 outer glass tube
39 inner glass tube
40 vacuum space
42 hermetic seal
43 end piece
44 annular portion: spring
45 bent spring offset
46 contact tabs
47 full length insulator
48 conduit seal end cap
49 glass tube retainer
50 seal ring
51 glass tube
52 conduit wedge seal
53 adjusting threads
54 outer boot vacuum seal
55 sela hose clamps
56 vacuum space
57 transition piece
58 square/triangular section
59 round section
60 internal plug
61 fluid inlet/outlet
62 inclined side planes
63 triangular conduit
64 horizontal lower plane
65 square fluid conduit
66 sq. conduit side planes

Having thus described the invention, what is claimed as new and desired to protect by Letters Patent are the following:

1. A concentrating solar collector array including a plurality of collectors each comprising:
a pair of stationary spaced conduit supports with vertical extensions,
a linear heat absorbing fluid conduit and outer conduit couplings are clamped to a cross member between said extensions and to said spaced conduit supports, each coupling including a space between the ends of adjacent conduits inserted therein,
at least one conduit insulator including an outer glass shell and a vacuum space between said conduit and shell,
means to suspend a reflector assembly from said clamped conduit,
said linear concentrating reflector assembly supported for pivoting about the fluid conduit within a pre-determined arc,
said reflector pivot means including a programmable motor, gears, and cross shaft to drive a plurality of capstans each including a plurality of pulleys, cable take-up means and cable ends connected to adjacent unitary reflectors,
said reflector assembly including two longitudinal corrugated board side panels secured to ends of a plurality of transversely aligned corrugated board reflector support segments having concave upper edges and linear bottom edges to form a unitary reflector assembly,
a reflector surface superposed over said concave supports, and,
fluid inlet and outlet coupling connections for serially joining conduits of the collector array.

2. The collector array of claim 1 wherein said at least one conduit insulator is a plurality of insulators, each with an inner transparent shell, an outer transparent shell, vacuum space there between, end connectors, and flexible spring means at both ends of each insulator.

3. The collector array of claim 1 wherein said at least one conduit insulator includes a single transparent tube bearing against a deformable seal in a tube retainer for adjustable movement within a threaded end seal cap having portions bearing against a deformable conduit seal, and including an outer boot vacuum seal and clamps between end caps and the conduit.

4. The collector array of claim 1 wherein the concave upper surface of the support segments is parabolic and includes a parabolic reflective surface.

5. The collector array of claim 4 wherein the reflective surface is superposed on and secured to flexible strips on the upper surface of the support segments, each with a plurality of side tab extensions, said tabs secured to at least one side of said support segments.

6. The collector array of claim 1 wherein said reflector surface is a laminate with a reflective film upper surface.

7. The collector array of claim 1 wherein the reflective surface is flexible, transparent, and has a reflective coating facing the focal line.

8. The collector array of claim 1 wherein each of said cable ends is attached to connectors on transverse extremities of said unitary reflector.

9. The collector array of claim 1 wherein reflector assembly longitudinal side panels include transverse support segment positioning slots in members secured to said side panels.

10. The collector array of claim 1 wherein exterior surfaces of the unitary reflector assembly have an impervious coating.

11. A concentrating solar collector array including a plurality of collectors each comprising:
   a pair of spaced stationary conduit supports,
   a shaped linear fluid conduit along the axis of the collector with a planar top surface parallel to the collector aperture and planar support surfaces for solar photovoltaic cells,
   said shaped conduit for insertion into a shaped aperture at one end of a transition coupling having a round outside surface for insertion into a conduit coupling,
   means to clamp said conduit coupling to said stationary collector support
   a pivot housing member with bushings and housing extensions for connection to reflector support arms,
   a unitary reflector assembly suspended from said pivot housing and reflector support arms,
   said unitary reflector assembly including two longitudinal corrugated board side panels secured to ends of a plurality of transversely aligned corrugated support segments having upper concave edges and linear bottom edges to form said unitary reflector assembly,
   said upper concave edge being a modified curve to disperse reflected rays into a band of vertically oriented loci of solar ray focus lines for impingement on the extended surface of photovoltaic cells secured to surfaces of the absorber conduit.

12. The collector array of claim 11 wherein said conduit is triangular and the modified reflector curve reflects a band of solar rays on two vertically inclined surfaces and said photovoltaic cells mounted thereon.

13. The collector array of claim 11 including said transition coupling having a triangular end and a round end.

14. The collector array of claim 11 wherein said conduit is square and the modified collector curve reflects a band of solar rays on said photovoltaic cells mounted on the bottom planar surface of the conduit.

15. The collector array of claim 11 wherein said transition coupling has a square end and a round end.

16. The collector array of claim 11 wherein said conduit is square and the reflector curve is modified to reflect a band of solar rays on said photovoltaic cells mounted on opposite vertical sides of the conduit.

17. The collector array of claim 11 wherein said transition coupling has a square end and a round end.

18. The collector array of claim 11 wherein said transition coupling includes a space adjacent an end, a solid barrier centered in said space, and a fluid connection between said barrier and the end of said coupling.

19. The collector array of claim 11 wherein exterior surfaces if the unitary reflector assembly have an impervious coating.

* * * * *